(12) United States Patent
Ottosson et al.

(10) Patent No.: US 8,425,014 B2
(45) Date of Patent: Apr. 23, 2013

(54) RING ELECTRODE FOR FLUID EJECTION

(75) Inventors: Mats Ottosson, Saltsjo-Boo (SE); Christoph Menzel, New London, NH (US); Paul A. Hoisington, Hanover, NH (US)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/275,201

(22) Filed: Oct. 17, 2011

(65) Prior Publication Data

US 2012/0050414 A1    Mar. 1, 2012

Related U.S. Application Data

(62) Division of application No. 12/389,317, filed on Feb. 19, 2009, now Pat. No. 8,061,820.

(51) Int. Cl.
*B41J 2/045* (2006.01)
*F04B 49/06* (2006.01)

(52) U.S. Cl.
USPC .................................. 347/68; 347/70; 417/53

(58) Field of Classification Search ............ 347/68, 347/71–72; 310/317, 365; 29/890.1
See application file for complete search history.

(56) References Cited

U.S. PATENT DOCUMENTS

| | | | |
|---|---|---|---|
| 6,019,458 A | 2/2000 | Shimada et al. | |
| 7,008,048 B2 | 3/2006 | Sakaida | |
| 7,084,555 B2 | 8/2006 | Bachellerie et al. | |
| 7,303,264 B2 | 12/2007 | Bibl et al. | |
| 2005/0134144 A1 | 6/2005 | Buhler et al. | |
| 2006/0087536 A1 | 4/2006 | Sugahara | |
| 2006/0164450 A1 | 7/2006 | Hoisington et al. | |
| 2008/0000059 A1 | 1/2008 | Bibl et al. | |
| 2008/0020573 A1 | 1/2008 | Birkmeyer et al. | |
| 2008/0030553 A1* | 2/2008 | Takahashi | 347/70 |
| 2009/0146532 A1 | 6/2009 | Kojima | |

FOREIGN PATENT DOCUMENTS

| | | |
|---|---|---|
| JP | 2000246898 A | 9/2000 |
| JP | 2006150948 A | 6/2006 |

OTHER PUBLICATIONS

International Search Report and Written Opinion for PCT Application No. PCT/US2010/024544, mailed Jun. 11, 2010, 13 pages.
Invitation to Pay Additional Fees for PCT Application No. PCT/US2010/024544, mailed Mar. 29, 2010.
Nakamura et al., "Trapped-Energy Piezoelectric Resonators with Elliptical Ring Electrodes." 44th Annual Symposium on Frequency Control, Tohoku University, Sendai, Japan, 6 pages.

* cited by examiner

*Primary Examiner* — Matthew Luu
*Assistant Examiner* — Lisa M Solomon
(74) *Attorney, Agent, or Firm* — Fish & Richardson P.C.

(57) ABSTRACT

Methods, systems, and apparatus for drive a pumping chamber of a fluid ejection system are disclosed. In one implementation, the actuator for drive the pumping chamber includes a continuous piezoelectric layer between a pair of drive electrodes and a continuous reference electrode. The pair of drive electrodes includes an inner electrode and an outer electrode surrounding the inner electrode. The actuator is further coupled to a controller which, during a fluid ejection cycle, applies a negative voltage pulse differential to the outer electrode to expand the pumping chamber for a first time period, then applies another negative voltage pulse differential to the inner electrode during a second time period after the first time period to contract the pumping chamber to eject a fluid drop.

7 Claims, 10 Drawing Sheets

RING ELECTRODE FOR FLUID EJECTION

PRIORITY INFORMATION

This application is a divisional and claims the priority of U.S. application Ser. No. 12/389,317, filed Feb. 19, 2009. The disclosure of the prior application is considered part of and this application is incorporated by reference herein in its entirety.

TECHNICAL FIELD

This specification relates to piezoelectricity-actuated fluid ejection.

BACKGROUND

A fluid ejection system typically includes a fluid path from a fluid supply to a nozzle assembly that includes nozzles from which fluid drops are ejected. Fluid drop ejection can be controlled by pressurizing fluid in the fluid path with an actuator, such as a piezoelectric actuator. The fluid to be ejected can be, for example, an ink, electroluminescent materials, biological compounds, or materials for formation of electrical circuits.

A printhead module in an ink jet printer is an example of a fluid ejection system. A printhead module typically has a line or an array of nozzles with a corresponding array of ink paths and associated actuators, and drop ejection from each nozzle can be independently controlled by one or more controllers. The printhead module can include a semiconductor printhead body in which the ink paths are formed and piezoelectric actuators attached to the printhead body. A nozzle can be defined by a separate layer that is attached to the printhead body. The printhead body can be made of a silicon substrate etched to define a pumping chamber along an ink path. One side of the pumping chamber is a membrane that is sufficiently thin to flex and expand or contract the pumping chamber when driven by the piezoelectric actuator. The piezoelectric actuator is supported on the membrane over the pumping chamber. The piezoelectric actuator includes a layer of piezoelectric material that changes geometry (or actuates) in response to a voltage applied across the piezoelectric layer by a pair of opposing electrodes. The actuation of the piezoelectric layer causes the membrane to flex, and flexing of the membrane thereby pressurizes ink in the pumping chamber along the ink path and eventually ejects an ink droplet out of the nozzle.

SUMMARY

This specification describes technologies related to fluid ejection. In general, a piezoelectric actuator that includes a ring electrode and piezoelectric material with a uniform poling direction can be actuated with a unipolar voltage waveform.

In one aspect, a fluid ejection system includes a substrate having a chamber formed therein, a membrane that forms a wall of the chamber and is operable to expand or contract the chamber by flexing, and an actuator supported on the membrane. The actuator includes a piezoelectric layer disposed between a drive electrode layer and a reference electrode layer. The piezoelectric layer includes a continuous planar piezoelectric material spanning the chamber and having a uniform poling direction substantially perpendicular to the continuous planar piezoelectric material. The drive electrode layer includes a plurality of drive electrodes, the plurality of drive electrodes including an inner electrode and an outer electrode surrounding the inner electrode. The reference electrode layer includes a reference electrode having a first portion spanning the inner electrode and a second portion spanning the outer electrode. Creation of a voltage differential between at least one of the plurality of drive electrodes and the reference electrode generates an electric field in the continuous planar piezoelectric material, and the electric field results in actuation of the continuous planar piezoelectric material to flex the membrane.

Implementations may include one or more of the following features. A controller may be electrically coupled to the plurality of drive electrodes and the reference electrode, and during an operation cycle to eject a fluid droplet, the controller may be operable to create a first voltage differential pulse between a first electrode in the plurality of drive electrodes and the reference electrode during a first time period to expand the chamber, and to create a second voltage differential pulse between a second electrode in the plurality of drive electrodes and the reference electrode during a second time period to contract the chamber, the second electrode being different from the first electrode and the second time period being after the first time period. The first voltage differential pulse and the second voltage differential pulse may each generate an electric field that points in substantially the same direction as the poling direction. The first electrode in the plurality of drive electrode may be the outer electrode, and the second electrode in the plurality of drive electrode may be the inner electrode.

The membrane may be a separate layer bonded to the substrate.

The inner electrode may be disposed over a central portion of the membrane and the outer electrode may be disposed over a peripheral portion of the membrane surrounding the inner electrode.

The inner electrode and the outer electrode may be the only drive electrodes disposed over the membrane.

The membrane may have a lateral dimension of D, and the inner electrode may have a lateral dimension of approximately ⅔ of D. The outer electrode may be in the shape of a ring, where the ring has an inner lateral dimension and an outer lateral dimension, and the inner lateral dimension of the ring may be greater than the lateral dimension of the inner electrode. The outer lateral dimension of the ring may be greater than the lateral dimension of the membrane. The lateral dimension of the inner electrode and the inner lateral dimension of the outer electrode may be such that a maximum volume displacement is achieved between expansion and contraction of the chamber. The lateral dimension of the inner electrode and the inner lateral dimension of the outer electrode may also be such that equal volume displacement is achieved between expansion and contraction of the chamber.

The continuous planar piezoelectric material may be a lead zirconate titanate (PZT) film.

In one aspect, a fluid ejection system includes a substrate having a chamber formed therein, a membrane that forms a wall of the chamber and is operable to expand or contract the chamber by flexing, and an actuator supported on the membrane. The actuator includes a piezoelectric layer disposed between a drive electrode layer and a reference electrode layer. The piezoelectric layer includes a continuous planar piezoelectric material spanning the chamber and having a uniform poling direction that is substantially perpendicular to the continuous planar piezoelectric material. The drive electrode layer includes a drive electrode in contact with the continuous planar piezoelectric material. The drive electrode is in the shape of a ring, disposed over a peripheral portion of the membrane, and being the sole drive electrode over the membrane in the drive electrode layer. The reference electrode layer includes a reference electrode spanning at least an area covered by the drive electrode. Creation of a voltage differential between the drive electrode and the reference electrode generates an electric field in the continuous planar piezoelectric material, and the electric field results in actuation of the continuous planar piezoelectric material to flex the membrane.

Implementations may include one or more of the following features. The fluid ejection system may further include a controller electrically coupled to the drive electrode and the reference electrode. During an operation cycle to eject a fluid droplet, the controller may be operable to create a voltage differential between a drive electrode and the reference electrode for a time period to expand the chamber, and to remove the voltage differential after the time period to contract the chamber. The uniform poling direction of the continuous planar piezoelectric material may point from the reference electrode layer to the drive electrode layer, and the voltage differential may be a negative voltage differential. And at the same time, the uniform poling direction of the continuous planar piezoelectric material may points away from the chamber.

The membrane may be a lateral dimension of D. The drive electrode may have an inner lateral dimension and an outer lateral dimension, and the outer lateral dimension of the drive electrode may be greater than the lateral dimension of the membrane. The inner lateral dimension of the drive electrode may be such that a maximum volume displacement is achieved between expansion and contraction of the chamber. The continuous planar piezoelectric material may be a lead zirconate titanate (PZT) film.

In one aspect, a fluid ejection system includes a substrate having a chamber formed therein, a membrane that forms a wall of the chamber and is operable to expand or contract the chamber by flexing, and an actuator supported on the membrane. The actuator includes a piezoelectric layer disposed between a drive electrode layer and a reference electrode layer. The piezoelectric layer includes a planar piezoelectric material spanning the chamber and having a uniform poling direction substantially perpendicular to the planar piezoelectric material. The drive electrode layer includes a plurality of drive electrodes. The plurality of drive electrodes includes an inner electrode and an outer electrode surrounding the inner electrode. The reference electrode layer includes a reference electrode, the reference electrode having a first portion spanning the inner electrode and a second portion spanning the outer electrode. The fluid ejection system further includes a controller electrically coupled to the pair of drive electrodes and the reference electrode. During an operation cycle to eject a fluid droplet, the controller is operable to create a first voltage differential pulse between a first electrode in the plurality of drive electrodes and the reference electrode during a first time period to expand the chamber. The controller is further operable to create a second voltage differential pulse between a second electrode in the plurality of drive electrodes and the reference electrode during a second time period to contract the chamber, the second electrode being different from the first electrode and the second time period being after the first time period.

Implementations may include one or more of the following features. The first voltage differential pulse and the second voltage differential pulse may each generate an electric field that points substantially in the same direction as the poling direction. The first electrode in the plurality of drive electrode may be the outer electrode, and the second electrode in the plurality of drive electrode may be the inner electrode.

The uniform poling direction of the planar piezoelectric material may point from the reference electrode layer to the drive electrode layer, the first voltage differential pulse may be a negative voltage differential pulse, and the second voltage differential pulse may be another negative voltage differential pulse. The uniform poling direction of the planar piezoelectric material may point away from the chamber. The uniform poling direction of the planar piezoelectric material may point toward the chamber.

The uniform poling direction of the planar piezoelectric material may point from the drive electrode layer to the reference electrode layer, the first voltage differential pulse may be a positive voltage differential pulse, and the second voltage differential pulse may be another positive voltage differential pulse. The uniform poling direction of the planar piezoelectric material may point away from the chamber. The uniform poling direction of the planar piezoelectric material may point toward the chamber.

The first voltage differential pulse and the second voltage differential pulse may each generate an electric field that points in a direction substantially opposite to the poling direction. The first electrode in the plurality of drive electrode is the inner electrode, and the second electrode in the plurality of drive electrode is the outer electrode.

The uniform poling direction of the planar piezoelectric material may point from the reference electrode layer to the drive electrode layer, the first voltage differential pulse may be a positive voltage differential pulse, and the second voltage differential pulse may be another positive voltage differential pulse. The uniform poling direction of the planar piezoelectric material may point away from the chamber. The uniform poling direction of the planar piezoelectric material may point toward the chamber.

The uniform poling direction of the planar piezoelectric material may point from the drive electrode layer to the reference electrode layer, the first voltage differential pulse may be a negative voltage differential pulse, and the second voltage differential pulse may be another negative voltage differential pulse. The uniform poling direction of the planar piezoelectric material may point away from the chamber. The uniform poling direction of the planar piezoelectric material may point toward the chamber.

In one aspect, a fluid ejection system includes a substrate having a chamber formed therein, a membrane that forms a wall of the chamber and is operable to expand or contract the chamber by flexing, and an actuator supported on the membrane. The actuator includes a piezoelectric layer disposed between a drive electrode layer and a reference electrode layer. The piezoelectric layer includes a planar piezoelectric material spanning the chamber and having a uniform poling direction that is substantially perpendicular to the planar piezoelectric material. The drive electrode layer includes a drive electrode in contact with the planar piezoelectric material. The drive electrode is in the shape of a ring, disposed over a peripheral portion of the membrane, and being the sole drive electrode over the membrane in the drive electrode layer. The reference electrode layer includes a reference electrode spanning at least an area covered by the drive electrode. The fluid ejection system further includes a controller electrically coupled to the drive electrode and the reference electrode. During an operation cycle to eject a fluid droplet, the controller is operable to create a voltage differential between a drive electrode and the reference electrode for a time period to expand the chamber, and to remove the voltage differential after the time period to contract the chamber.

Implementations may include one or more of the following features. The uniform poling direction of the planar piezoelectric material may point from the reference electrode layer to the drive electrode layer. The voltage differential may be a negative voltage differential. The uniform poling direction of the planar piezoelectric material may points away from the chamber. The uniform poling direction of the planar piezoelectric material may point toward the chamber.

The uniform poling direction of the planar piezoelectric material may point from the drive electrode layer to the reference electrode layer. The voltage differential may be a positive voltage potential. The uniform poling direction of the planar piezoelectric material may point away from the chamber. The uniform poling direction of the planar piezoelectric material may point toward the chamber.

In one aspect, a method for actuating a pumping chamber includes generating a negative voltage differential for a time period between a drive electrode and a reference electrode of a piezoelectric actuator to expand the pumping chamber, and removing the negative voltage differential after the time period to contract the pumping chamber. The pumping chamber is a cavity formed in a substrate. The cavity is covered by a membrane that is operable to expand or contract the pumping chamber by flexing. The piezoelectric actuator is supported on the membrane and includes a planar piezoelectric material, the drive electrode and the reference electrode. The drive electrode and the reference electrode are disposed on opposite sides of the planar piezoelectric material. The drive electrode is in a shape of a ring, disposed over a peripheral portion of the membrane, and being the sole drive electrode over the membrane. The planar piezoelectric material spans the chamber and has a uniform poling direction that is substantially perpendicular to the planar piezoelectric material and points away from the pumping chamber. The reference electrode is disposed between the membrane and the drive electrode. The reference electrode spans at least an area covered by the drive electrode.

In one aspect, a fluid ejection system includes a substrate having a chamber and a membrane. The membrane covers one side of the chamber and is operable to expand or contract the chamber by flexing. The fluid ejection system further includes an actuator on the membrane. The actuator includes a piezoelectric layer disposed between a drive electrode layer and a reference electrode layer. The piezoelectric layer has a uniform poling direction substantially perpendicular to a surface of the membrane in contact with the actuator. The drive electrode layer includes a plurality of drive electrodes. The plurality of drive electrodes includes an inner electrode and an outer electrode surrounding the inner electrode. The fluid ejection system further includes a controller electrically coupled to the actuator to provide a unipolar waveform to the inner electrode and outer electrode.

Implementations may include one or more of the following features. During an operation cycle to eject a fluid droplet, the controller may be operable to create a first voltage differential pulse between a first electrode in the plurality of drive electrodes and the reference electrode during a first time period to expand the chamber, and to create a second voltage differential pulse between a second electrode in the plurality of drive electrodes and the reference electrode during a second time period to contract the chamber. The second electrode may be different from the first electrode and the second time period may be after the first time period. The first voltage differential pulse and the second voltage differential pulse may each generate an electric field that is substantially in the same direction as the poling direction. The first electrode in the plurality of drive electrode may be the outer electrode, and the second electrode in the plurality of drive electrode may be the inner electrode.

In one aspect, a fluid ejection system includes a substrate having a chamber and a membrane. The membrane covers one side of the chamber and is operable to expand or contract the chamber by flexing. The fluid ejection system further includes an actuator on the membrane. The actuator includes a piezoelectric layer disposed between a drive electrode layer and a reference electrode layer. The piezoelectric layer has a uniform poling direction substantially perpendicular to a surface of the membrane in contact with the actuator. The drive electrode layer includes a drive electrode in contact with the piezoelectric material. The drive electrode is ring-shaped and disposed over a peripheral portion of the membrane over the chamber, and being the sole drive electrode over the membrane in the drive electrode layer. The fluid ejection system further includes a controller electrically coupled to the actuator to provide a unipolar waveform to the drive electrode.

The unipolar waveform applied to the actuator may create an electrical field in the piezoelectric layer that is substantially in the same direction as the poling field.

In one aspect, a fluid ejection system includes a substrate having a chamber and a membrane. The membrane covers one side of the chamber and is operable to expand or contract the chamber by flexing. The fluid ejection system further includes an actuator on the membrane. The actuator includes a piezoelectric layer disposed between a drive electrode layer and a reference electrode layer. The piezoelectric layer has a uniform poling direction substantially perpendicular to a surface of the membrane in contact with the actuator. The drive electrode layer includes a plurality of drive electrodes. The plurality of drive electrodes includes an inner electrode and an outer electrode surrounding the inner electrode. The fluid ejection system further includes a controller electrically coupled to the actuator to provide a unipolar waveform to the inner electrode and outer electrode.

Implementations may include one or more of the following features. During an operation cycle to eject a fluid droplet, the controller may be operable to create a first voltage differential pulse between a first electrode in the plurality of drive electrodes and the reference electrode during a first time period to expand the chamber, and to create a second voltage differential pulse between a second electrode in the plurality of drive electrodes and the reference electrode during a second time period to contract the chamber, the second electrode being different from the first electrode and the second time period being after the first time period. The first voltage differential pulse and the second voltage differential pulse may each generate an electric field that is substantially in the same direction as the poling direction. The first electrode in the plurality of drive electrode may be the outer electrode, and the second electrode in the plurality of drive electrode may be the inner electrode.

In one aspect, a fluid ejection system includes a substrate having a chamber and a membrane. The membrane covers one side of the chamber and is operable to expand or contract the chamber by flexing. The fluid ejection system further includes an actuator on the membrane. The actuator includes a piezoelectric layer disposed between a drive electrode layer and a reference electrode layer. The piezoelectric layer has a uniform poling direction substantially perpendicular to a surface of the membrane in contact with the actuator. The drive electrode layer includes a drive electrode in contact with the piezoelectric material. The drive electrode is ring-shaped and disposed over a peripheral portion of the membrane over the chamber, and being the sole drive electrode over the membrane in the drive electrode layer. The fluid ejection system further includes a controller electrically coupled to the actuator to provide a unipolar waveform to the drive electrode.

The unipolar waveform applied to the actuator may create an electrical field in the piezoelectric layer that is substantially in the same direction as the poling field.

The technology disclosed can offer one or more of the following advantages. A ring-shaped drive electrode can eliminate the need for a positive drive voltage in a fluid ejection cycle and the need for maintaining a quiescent negative bias while idle. A dual electrode design can permit the piezoelectric layer in the actuator to remain in a neutral and relaxed state rather than a pre-compressed state while idle. This can reduce fatigue of the piezoelectric material. For example, only negative drive voltages need be applied across the piezoelectric layer during each fluid ejection cycle. The electric field created inside the piezoelectric layer can point in the same direction as the poling direction of the piezoelectric material during the entire fluid ejection cycle. Fatigue and depolarization of the piezoelectric material in the piezoelectric actuator can be reduced.

A dual electrode design can provide a greater total volume displacement for a given drive voltage as compared to a single electrode design. Alternatively, for a given volume displacement required during a fluid ejection cycle, the drive voltage can be reduced roughly by half as compared to a single electrode design.

An increase in volume displacement efficiency due to the dual electrode design can allow for a smaller actuator membrane to achieve sufficient volume displacement for fluid ejection, and nozzle density can be increased. In addition, the reduced membrane area can also improve membrane strength for fluid ejection.

Other aspects, features, and advantages will be apparent from the description and drawings and from the claims.

BRIEF DESCRIPTION OF THE DRAWINGS

Like reference numbers and designations in the various drawings indicate like elements.

DETAILED DESCRIPTION

Figure 1:
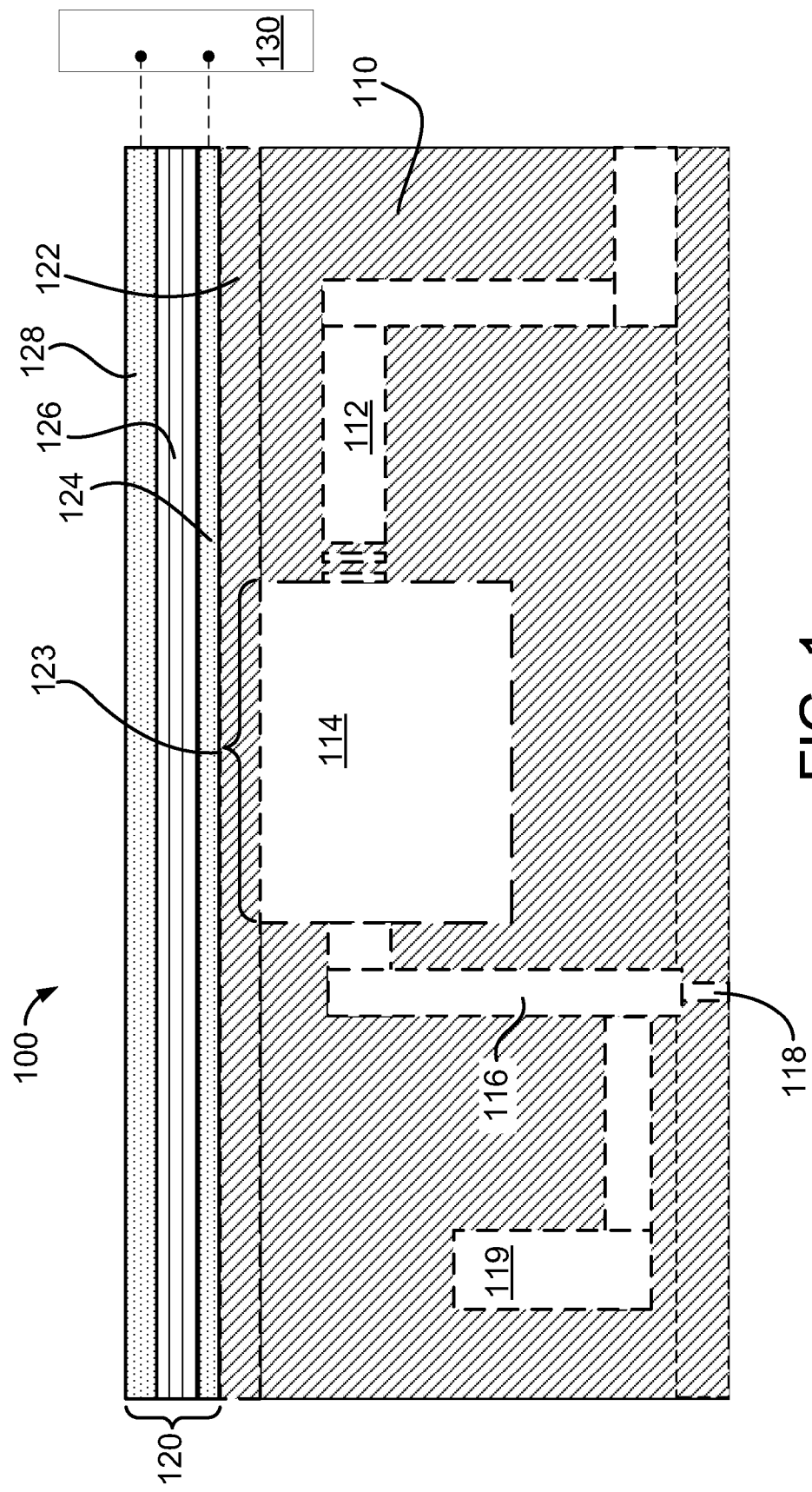
FIG. 1 is a schematic cross-sectional view of an exemplary fluid ejection system.

FIG. 1 is a schematic cross-sectional view of an exemplary fluid ejection system (e.g., a printhead module 100).

The printhead module 100 includes a plurality of piezoelectric actuator structures 120 and a module substrate 110 through which a plurality of passages are formed.

The module substrate 110 can be a monolithic semiconductor body such as a silicon substrate. Each passage through the silicon substrate defines a flow path for the fluid (e.g., ink) to be ejected (only one flow path and one actuator are shown in the cross-sectional view of FIG. 1). Each flow path can include a fluid inlet 112, a pumping chamber 114, a descender 116, and a nozzle 118. The flow path can further include a recirculation path 119 so that ink can flow through the flow path even when fluid is not being ejected through the nozzle 118. The pumping chamber 114 is a cavity formed in the module substrate 110. One side of the pumping chamber 114 is a membrane 123 that is capable of flexing to expand or contract the pumping chamber 114 and pump the fluid along the flow path. The area of the membrane 123 can be defined by the edge of the pumping chamber 114 supporting the membrane 123. Stated another way, the lateral shape of the membrane 123 is defined by the perimeter of the pumping chamber 114 under the membrane. The membrane 123 can be formed by joining (e.g., bonding, for example, silicon-to-silicon fusion bonding) a membrane layer 122 to the module substrate 110 over an open side of the pumping chamber 114. Alternatively, the membrane 123 can be a thin portion of the monolithic semiconductor substrate that was left intact during the etching of the pumping chamber 114. The piezoelectric actuator structure 120 is positioned over the pumping chamber 114 and supported on the exposed side of the membrane 123.

The piezoelectric actuator structure 120 includes a first electrode layer (e.g., a reference electrode layer 124, e.g., connected to ground), a second electrode layer (e.g., a drive electrode layer 128), and a piezoelectric layer 126 disposed between the first and the second electrode layers. The piezoelectric actuator structure 120 is supported on (e.g., bonded to) the module substrate 110 containing the membrane 123. In some implementations, the piezoelectric actuator structure 120 is fabricated separately and then secured, (e.g., bonded) to the module substrate 110. In some implementations, the piezoelectric actuator structure 120 can be fabricated in place over the pumping chamber by sequentially deposition of layers onto the module substrate 110 (or the membrane layer 122).

The piezoelectric layer 126 changes geometry, or bends, in response to a voltage applied across the piezoelectric layer between the first electrode layer and the second electrode layer. The bending of the piezoelectric layer 126 flexes the membrane 123 which in turn pressurizes the fluid in the pumping chamber 114 to controllably force fluid through the descender 116 and eject drops of fluid out of the nozzle 118. Thus, each flow path with its associated actuator provides an individually controllable fluid ejector unit.

In this example, the first electrode layer is the reference electrode layer 124. The reference electrode layer 124 contains one or more reference electrodes. A reference electrode can be continuous and optionally can span multiple actuators. A continuous reference electrode can be a single continuous conductive layer disposed between the piezoelectric layer 126 and the exposed surface of the membrane layer 122 (or the exposed surface of the monolithic module substrate containing the membrane 123). The membrane 123 isolates the reference electrode layer 124 and the piezoelectric layer 126 from the fluid in the pumping chamber 114. The drive electrode layer 128 is on the opposing side of the piezoelectric layer 126 from the reference electrode layer 124. The drive electrode layer 128 includes patterned conductive pieces serving as the drive electrodes for the piezoelectric actuator structure 120.

The drive electrode and the reference electrode are electrically coupled to a controller 130 which supplies a voltage differential across the piezoelectric layer 126 at appropriate times and for appropriate durations in a fluid ejection cycle. A voltage differential between a first electrode and a second electrode is a measure of the voltage applied to the first electrode (the so-called "drive electrode") relative to the voltage applied to the second electrode (the so-called "reference electrode"). Where the reference electrode is connected to ground, the drive voltage differential between the drive electrode and the reference electrode is equal to the voltage applied to the drive electrode, and the terms "drive voltage" and "drive voltage differential" are used interchangeably. Typically, electric potentials on reference electrodes are held constant, or are commonly controlled with the same voltage waveform across all actuators, during operation, e.g., during the firing pulse.

A negative voltage differential exists when the applied voltage on the drive electrode is lower than the applied voltage on the reference electrode. A positive voltage differential exists when the applied voltage on the drive electrode is higher than the applied voltage on the reference electrode. In such implementations, the "drive voltage" or "drive voltage pulse" applied to the drive electrode is measured relative to the voltage applied to the reference electrode in order to achieve the desired drive voltage waveforms for piezoelectric actuation.

The compliance of the membrane 123 is such that it allows actuation of the piezoelectric layer 126 to flex the membrane 123 over the pumping chamber 114 and pressurize the fluid in the pumping chamber 114.

The piezoelectric layer 126 can include a substantially planar piezoelectric material, such as a lead zirconium titanate ("PZT") film. The thickness of the piezoelectric material is within a range that allows the piezoelectric layer to flex in response to an applied voltage. For example, the thickness of the piezoelectric material can range from about 0.5 to 25 microns, such as about 1 to 7 microns. The piezoelectric material can extend beyond the area of the membrane 123 over the pumping chamber 114. The piezoelectric material can span multiple pumping chambers in the module substrate. Alternatively, the piezoelectric material can include cuts in regions that do not overlie the pumping chambers, in order to segment the piezoelectric material of the different actuators from each other and reduce cross-talk.

The thin film of piezoelectric material can be deposited on the membrane layer 122 by sputtering. Types of sputter deposition can include magnetron sputter deposition (e.g., RF sputtering), ion-beam sputtering, reactive sputtering, ion-assisted deposition, high-target-utilization sputtering, and high power impulse magnetron sputtering. Sputtered piezoelectric material (e.g., piezoelectric thin film) can have a large as-deposited polarization. Some environments that are used for sputtering piezoelectric material apply a direct current (DC) field during sputtering. The DC field causes the piezoelectric material to be polarized (or "poled") in the orientation that results when a negative voltage is applied to the exposed side of the piezoelectric material. In the configuration shown in FIG. 1, the poling direction of the piezoelectric layer produced using such methods points from the reference electrode layer 124 toward the drive electrode layer 128, e.g., substantially perpendicular to the planar piezoelectric layer 126.

Once the piezoelectric material has been poled, application of an electric field across the piezoelectric material will displace the piezoelectric material. For example, a negative voltage differential between the drive electrode and the reference electrode in FIG. 1 results in an electric field in the piezoelectric layer 126 that points substantially in the same direction as the poling direction. In response to the electric field, the piezoelectric material between the drive electrode and the reference electrode expands vertically and contracts laterally, causing the piezoelectric film over the pumping chamber to flex. Alternatively, a positive voltage differential between the drive electrode and the reference electrode in FIG. 1 results in an electric field within the piezoelectric layer 126 that points in a direction substantially opposite to the poling direction. In response to the electric field, the piezoelectric material between the drive electrode and the reference electrode contracts vertically and expands laterally, causing the piezoelectric film over the pumping chamber to flex in the opposite direction. The direction and shape of the deflection depends on the shape of the drive electrode and the natural bending mode of the piezoelectric film that spans beyond the membrane over the pumping chamber.

Designs and optimizations of the drive electrodes to improve volume displacement in the pumping chamber are discussed in further detail in the sections that follow.

Central Electrode

Figure 2A:
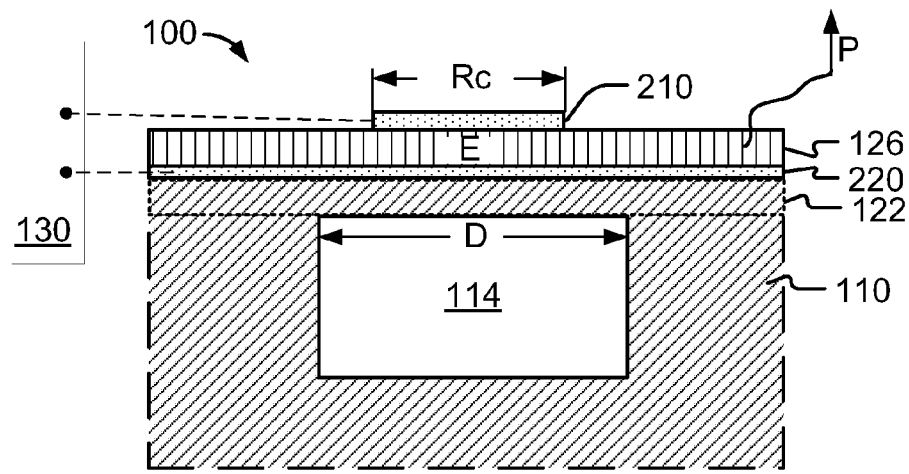
FIG. 2A is a schematic cross-sectional view of an exemplary fluid ejection system with a central drive electrode.
Figure 2B:
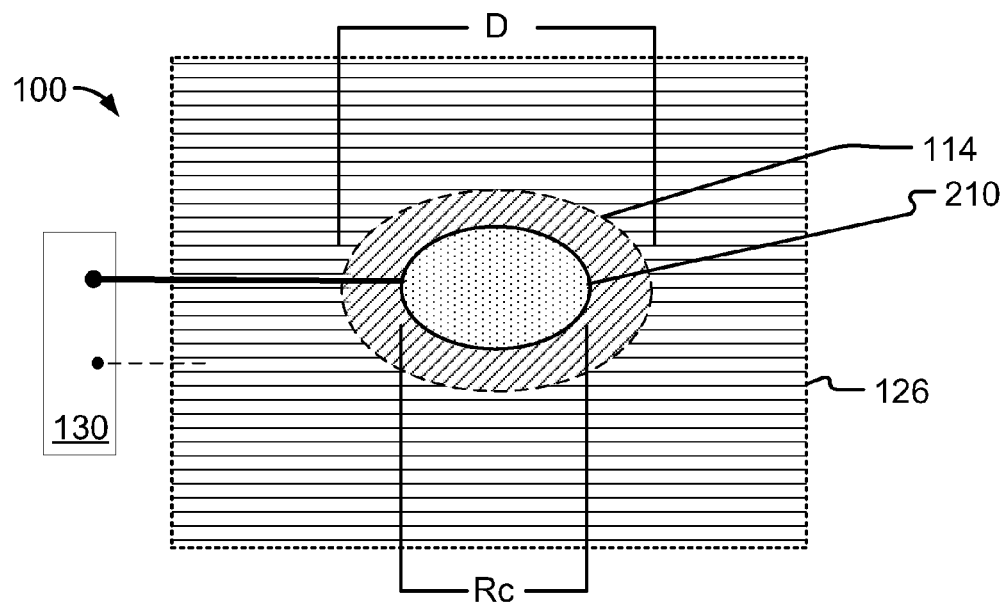
FIG. 2B is a schematic top view of an exemplary fluid ejection system with a central drive electrode.

FIG. 2A is a schematic cross-sectional view of the exemplary fluid ejection system 100 with a central drive electrode 210 in the drive electrode layer. FIG. 2B is a schematic top-view of the same exemplary fluid ejection system 100 shown in FIG. 2A.

The exemplary fluid ejection system 100 in FIGS. 2A-2B includes the module substrate 110 with the embedded pumping chamber 114. The pumping chamber 114 is connected to the flow path between the fluid inlet and the nozzle (not shown). The top side of the pumping chamber 114 is covered by the membrane 123. In this example, the membrane has a lateral dimension, i.e., parallel to the flat surface of the substrate 110, D.

The piezoelectric actuator structure is placed over and supported on the membrane 123. The piezoelectric material in the actuator is poled in a direction pointing from the bottom surface to the top surface of the piezoelectric layer 126. The drive electrode layer includes a central drive electrode 210 in contact with the top surface of the piezoelectric layer 126. The central drive electrode is a single conductive piece (e.g., a disc) that has a lateral dimension, Rc. In this single electrode design, the central drive electrode 210 is positioned over the pumping chamber in exclusion of any other drive electrode in the drive electrode layer. In some implementations, the central drive electrode is preferably placed over the central portion of the membrane to achieve maximum deflection. The lateral dimension of the central drive electrode Rc can vary from a fraction of D (e.g., ⅔ of D or ¾ of D) to slightly greater than D (e.g., up to about 10% larger than D). The reference electrode layer includes a reference electrode 220 disposed between the piezoelectric layer 126 and the top surface of the membrane layer 122. The reference electrode can span at least the area projected by the drive electrode (i.e., the central drive electrode 210). In some implementations, the reference electrode can also span the drive electrodes of multiple actuators over multiple pumping chambers.

The piezoelectric actuator is controlled by the controller 130 which is electrically coupled to the drive electrode 210 and the reference electrode 220. The controller 130 can include one or more waveform generators that supply appropriate voltage pulses to the drive electrode 210 to deflect the actuator membrane in a desired direction during a droplet ejection cycle. The controller 130 can further be coupled to a computer or processor for controlling the timing, duration, and strength of the drive voltage pulses.

When using a central drive electrode such as that shown in FIGS. 2A-2B, a negative voltage differential applied across the piezoelectric layer generates an electric field, E, that points substantially in the same direction as the poling direction, P. The electric field forms primarily in the piezoelectric material beneath the drive electrode and in the central portion of the membrane over the pumping chamber 114. In response the electric field, the piezoelectric material expands vertically and contracts laterally. As a result, the central portion of the membrane tends to form a concave shape (from the actuator side) and thus bows inwardly (toward the chamber), contracting the pumping chamber 114. Alternatively, a positive voltage differential applied across the piezoelectric material generates an electric field that points in a direction opposite to the poling direction of the piezoelectric material. In response to the electric field, the piezoelectric material contracts vertically and expands laterally. As a result, the central portion of the membrane tends to form a convex shape (from the actuator side) and thus bows outwardly (away from the chamber), expanding the pumping chamber 114.

Figure 2C:
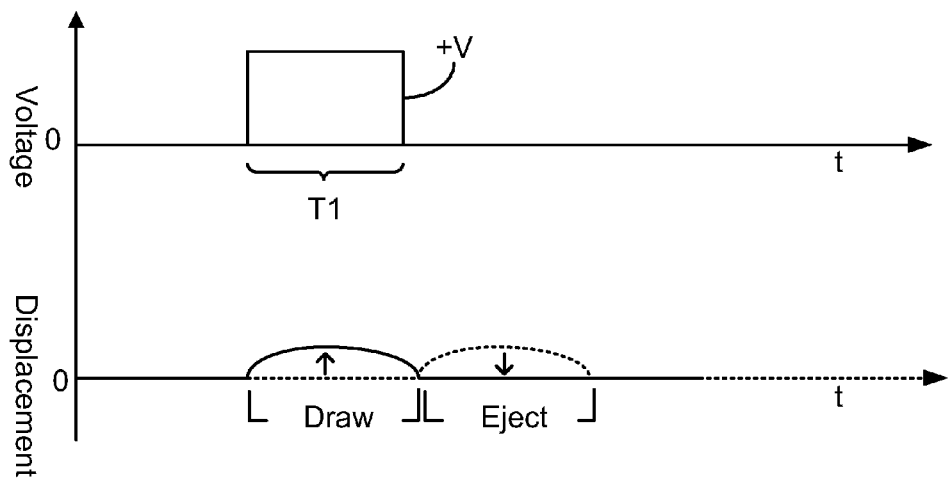
FIG. 2C is an exemplary drive voltage waveform for a droplet ejection cycle in the fluid ejection system of FIGS. 2A-2B.

FIG. 2C is an exemplary drive voltage waveform for a droplet ejection cycle in the fluid ejection system of FIGS. 2A-2B. In general, during a fluid ejection cycle, the pumping chamber first expands to draw in fluid from the fluid supply, and then contracts to eject a fluid droplet from the nozzle. Therefore, when using the fluid ejection system utilizing a central drive electrode (such as the one in FIGS. 2A-2B) and a reference electrode, the fluid ejection cycle includes first applying a positive voltage pulse to the drive electrode to expand the pumping chamber 114 and then applying a negative voltage pulse to the drive electrode to contract the pumping chamber 114. Alternatively, as shown in FIG. 2C, a single positive voltage pulse of magnitude V and duration T1 is applied to the drive electrode to expand the pumping chamber and draw in the fluid, and at the end of the pulse, the pumping chamber contracts from the expanded state back to a relaxed state and ejects a fluid drop.

Expanding the pumping chamber from a relaxed state using a central drive electrode requires a positive voltage differential being applied across the piezoelectric layer between the central drive electrode and the reference electrode. One drawback with using such a positive drive voltage differential is that the electric field generated in the piezoelectric layer points in a direction opposite to the poling direction of the piezoelectric material. Repeated application of the positive voltage differential will cause depolarization of the piezoelectric layer and reduce the effectiveness of the actuator over time.

Figure 2D:
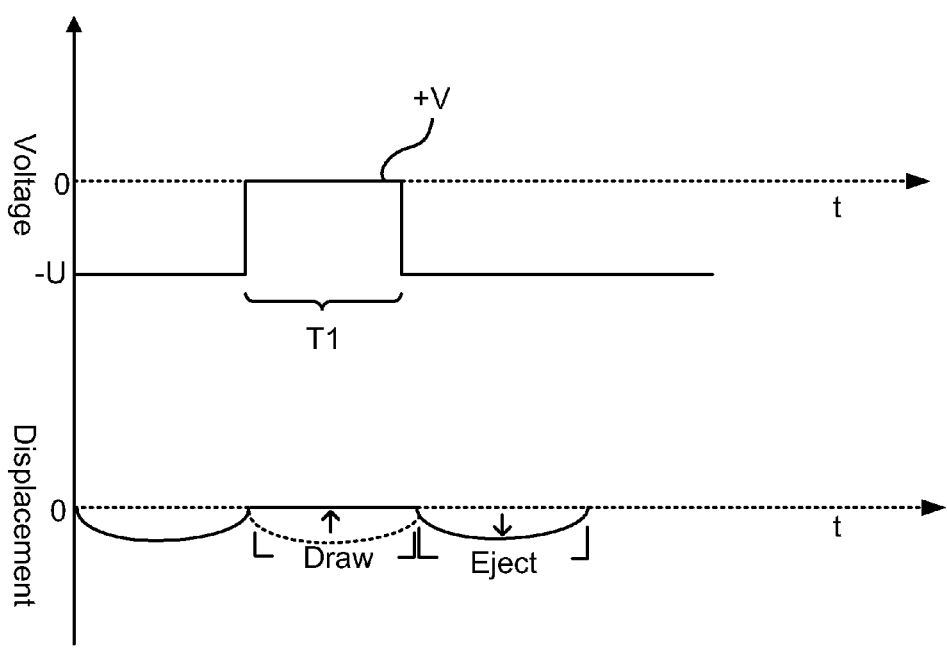
FIG. 2D is another exemplary drive voltage waveform for a droplet ejection cycle in the fluid ejection system of FIGS. 2A-2B.

To avoid using a positive drive voltage differential, the drive electrode can be maintained at a quiescent negative bias relative to the reference electrode, and can be restored to neutral only during the expansion phase of the fluid ejection cycle. FIG. 2D illustrates an exemplary drive voltage waveform that utilizes a quiescent negative bias. In this alternative, the pumping chamber is kept at a pre-compressed state by the quiescent negative bias on the central drive electrode while idle. During a fluid ejection cycle, the negative voltage bias is removed from the central drive electrode for a time period T1, and then reapplied until the start of the next fluid ejection cycle. When the negative bias is removed from the central drive electrode, the pumping chamber expands from the pre-compressed state to the relaxed state and draws in fluid from the inlet. After the time period T1, the negative bias is reapplied to the central drive electrode and the pumping chamber contracts from the relaxed state to the pre-compressed state and ejects a droplet from the nozzle. This alternative drive method eliminates the need to apply a positive voltage differential between the drive electrode and the reference electrode. However, prolonged exposure to a negative quiescent bias and constant internal stress can cause deterioration of the piezoelectric material.

An alternative design utilizing a ring-shaped drive electrode avoids the use of either a positive drive voltage differential or a quiescent negative bias on the drive electrode relative to the reference electrode. Details of the ring-shaped drive electrode design are described in the sections that follow.

Ring Electrode

Figure 3A:
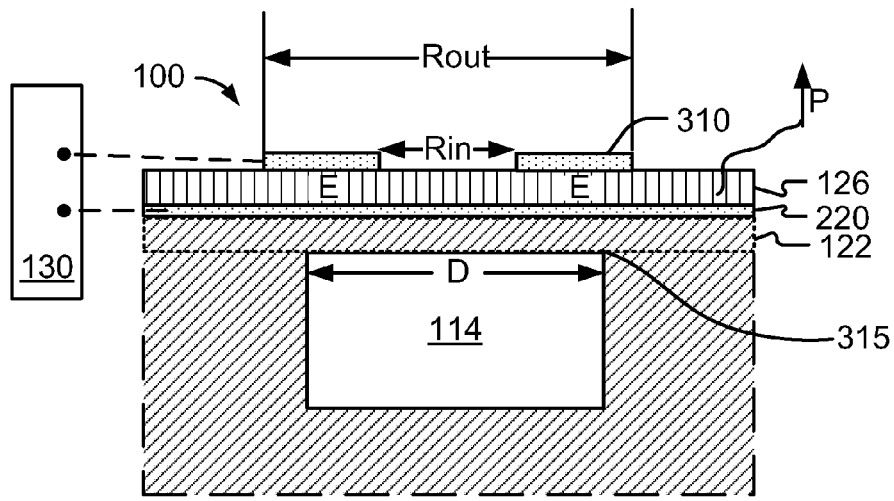
FIG. 3A is a schematic cross-sectional view of an exemplary fluid ejection system with a ring-shaped drive electrode.
Figure 3B:
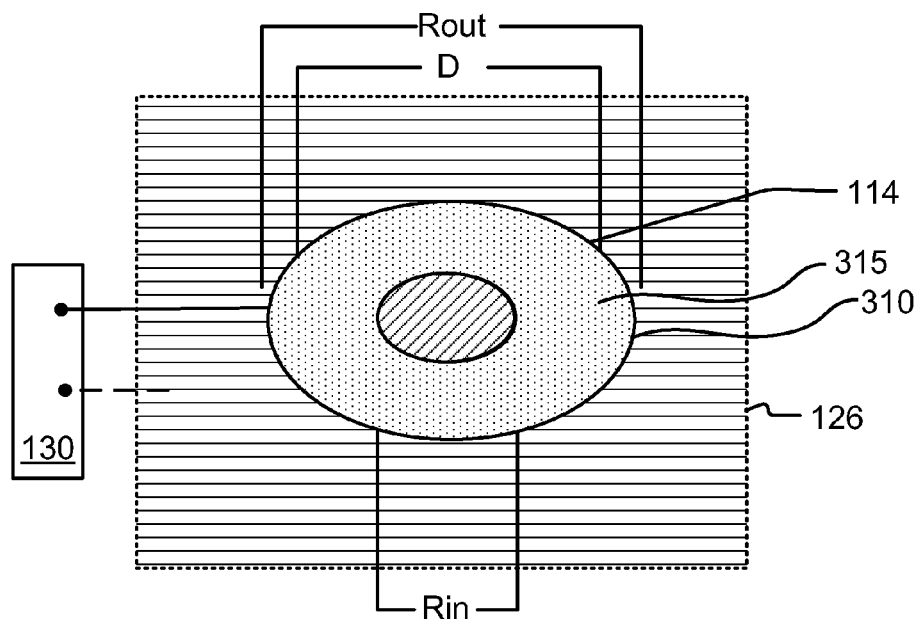
FIG. 3B is a schematic top view of an exemplary fluid ejection system with a ring-shaped drive electrode.

FIG. 3A is a schematic cross-sectional view of an exemplary fluid ejection system 100 with a ring-shaped drive electrode 310. FIG. 3B is a schematic top view of the same exemplary fluid ejection system 100 shown in FIG. 3A.

The exemplary fluid ejection system 100 in FIGS. 3A-3B includes the module substrate 110 with the embedded pumping chamber 114. The pumping chamber 114 is connected to the flow path between the fluid inlet and the nozzle (not shown). In some implementations, the top side of the pumping chamber 114 is covered by the membrane 123. The membrane has a lateral dimension, D.

The piezoelectric actuator structure is placed over and supported on the membrane. The piezoelectric material in the actuator is poled in a direction pointing from the bottom surface to the top surface of the piezoelectric layer 126, i.e., substantially perpendicular to the membrane. The drive electrode layer includes a ring-shaped drive electrode 310 in contact with the top surface of the piezoelectric layer 126.

The ring-shaped drive electrode 310 is a conductive piece that has an aperture or opening in the middle (e.g., a circular ring). The ring-shaped drive electrode can be characterized by an outer shape of the conductive piece and an inner shape of the opening (or aperture) in the conductive piece. The inner shape and the outer shape do not have to be geometrically similar or concentric. However, in some implementations the width of the ring can be roughly uniform around the entirety of the ring or most part of the ring.

In this single electrode design, the ring-shaped drive electrode 310 is positioned over the pumping chamber in exclusion of any other drive electrode in the drive electrode layer. The opening of the ring-shaped drive electrode is placed over the central portion of the membrane over the pumping chamber 114. The conducting portion of the ring-shaped drive electrode is placed over the peripheral portion of the membrane. The perimeter 315 of the membrane over the pumping chamber is entirely covered by the ring-shaped electrode 310 as shown in FIGS. 3A-3B. In FIGS. 3A-3B, the outer and inner edge of the ring-shaped drive electrode is aligned with (i.e., parallel to) the perimeter of the membrane over the pumping chamber.

The ring-shaped drive electrode 310 can be characterized by an inner lateral dimension $R_{in}$, for the inner shape of the opening and an outer lateral dimension $R_{out}$ for the outer shape of the conductive piece. The inner lateral dimension of the ring-shaped drive electrode $R_{in}$ can range from a fraction of D, e.g., ⅔ of D or ¾ of D, to slightly less than the outer lateral dimension $R_{out}$. The outer lateral dimension of the ring-shaped drive electrode $R_{out}$ is at least D, and can be greater than D, e.g., about 10% greater than D. In some implementations, for a pumping chamber with a lateral dimension of roughly 150 microns, the outer lateral dimension of the ring-shaped electrode is about 5-10 microns greater than the lateral dimension of the pumping chamber.

The reference electrode layer includes a reference electrode 220 disposed between the piezoelectric layer 126 and the top surface of the membrane layer 122. The reference electrode 220 can span at least the area projected by the top drive electrode (i.e., the ring-shaped drive electrode 310). In some implementations, the reference electrode can span beyond the area covered by the top drive electrode to cover the central region enclosed by the ring-shaped drive electrode. In some implementations, the reference electrode can also span one or more actuators.

The piezoelectric actuator is controlled by the controller 130 which is electrically coupled to the drive electrode 310 and the reference electrode 220. The controller 130 can include one or more waveform generators that supply appropriate voltage pulses to the drive electrode 210 to deflect the actuator membrane in a desired direction during a droplet ejection cycle. The controller 130 can further be coupled to a computer or processor for controlling the timing, duration, and strength of the voltage pulses.

When using the ring-shaped drive electrode and the reference electrode such as those shown in FIGS. 3A-3B, a negative voltage differential applied across the piezoelectric layer generates an electric field that points substantially in the same direction as the poling direction. The electric field forms primarily in the piezoelectric material underneath the ring-shaped drive electrode and over the peripheral portion of the membrane. In response to the electric field, the piezoelectric material under the ring-shaped drive electrode expands vertically and contracts laterally. As a result, the central portion of the membrane tends to form a convex shape (from the actuator side) and thus bows outwardly (away from the chamber), expanding the pumping chamber 114. Alternatively, a positive voltage differential applied across the piezoelectric layer generates an electric field that points in a direction opposite to the poling direction. In response to the electric field, the piezoelectric material under the drive electrode contracts vertically and expands laterally. As a result, the central portion of the membrane tends to form a concave shape (from the actuator side) and thus bows inwardly (toward the chamber), contracting the pumping chamber 114.

The deflection of the membrane under a ring-shaped drive electrode is in the opposite direction as that under a central drive electrode if the same voltage differential is applied across the piezoelectric layer between the drive electrode and the reference electrode. This is due to the natural bending mode that exists in a piezoelectric film. Although the local behavior of the piezoelectric film underneath a ring-shaped drive electrode is similar to that underneath a central drive electrode, by using a piezoelectric film that extends beyond the area covered by the drive electrode, additional deflection is created in the piezoelectric material over the central region of the membrane due to the tensions created underneath the drive electrode. Such deflection would not naturally occur if the piezoelectric layer is segmented at the inner edge of the ring-shaped electrode.

Figure 3C:
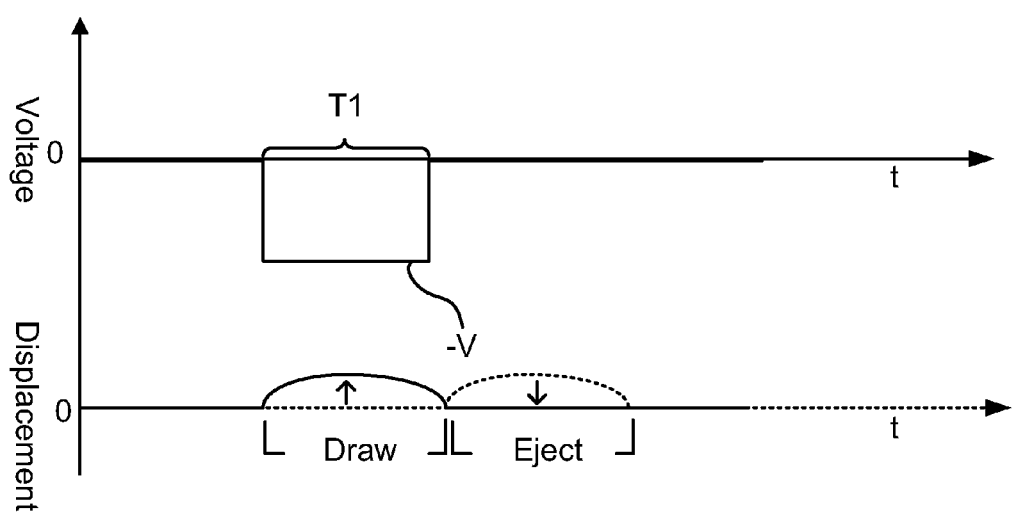
FIG. 3C is an exemplary drive voltage waveform for a droplet ejection cycle in the fluid ejection system of FIGS. 3A-3B.

FIG. 3C is an exemplary drive voltage waveform for a droplet ejection cycle in the fluid ejection system of FIGS. 3A-3B. Because a ring-shaped drive electrode creates the opposite deflection as a central drive electrode, a negative drive voltage differential can be used to replace the positive voltage differential in FIG. 2C and achieve the same fluid ejection cycle in the pumping chamber. In addition, there is also no need to maintain a quiescent negative bias on the drive electrode to achieve a pumping action. During a fluid ejection cycle in the fluid ejection system 100 as shown in FIGS. 3A-3B, a negative voltage pulse of magnitude −V is first applied to the ring-shaped drive electrode 310 for a time period T1, the pumping chamber 114 expands to draw in fluid from the fluid supply, then at the end of the negative voltage pulse, the pumping chamber 114 contracts and goes from the expanded state back to a relaxed state, ejecting a fluid drop from the nozzle.

A ring-shaped drive electrode solves the aforementioned drawbacks of the central drive electrode. A negative voltage pulse can be used as drive signals for fluid ejection, and there is no exposure to a quiescent bias, therefore, the ring-shaped drive electrode can improve the life span of the piezoelectric material in the actuator.

Figure 4A:
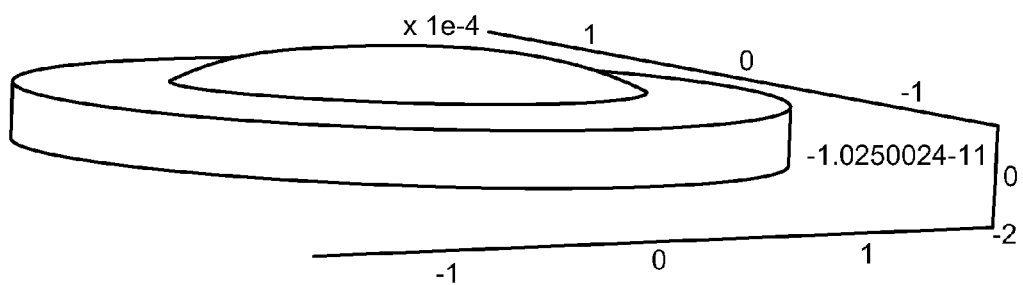
FIG. 4A illustrates the deflection of a piezoelectric membrane under a positive voltage applied between a central drive electrode and a continuous reference electrode.
Figure 4B:
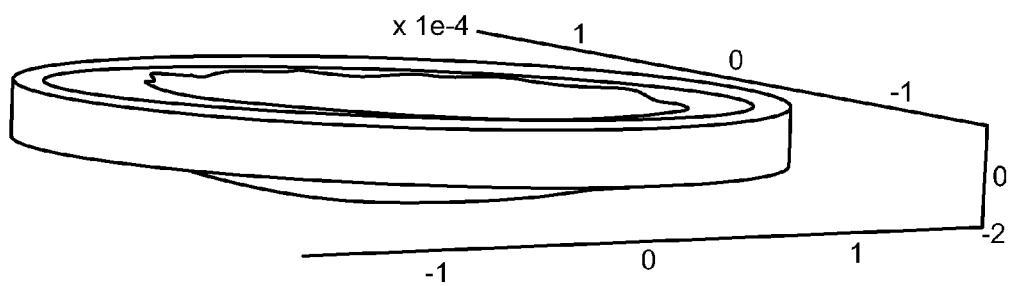
FIG. 4B illustrates the deflection of a piezoelectric membrane under a positive voltage applied between a ring-shaped drive electrode and a reference electrode.

FIG. 4A illustrates the deflection of a piezoelectric membrane under a positive voltage differential applied between a circular central drive electrode and a reference electrode. FIG. 4B illustrates the deflection of a piezoelectric membrane under a positive voltage differential applied between an annular ring-shaped drive electrode and a reference electrode.

In FIG. 4A, a positive voltage differential of 1V is applied across the central portion of the circular piezoelectric membrane while the edge is held at ground. The radius of the pumping chamber is 150 microns and the total central displacement is approximately 7.1 nm, and the total volume expansion is $142 \times 10^{18}$ m$^3$.

In FIG. 4B, a positive voltage differential of 1V is applied across the edge of the piezoelectric membrane while the central region is held at ground. The radius of the pumping chamber is also 150 microns, and the total central displacement is approximately −4.6 nm, and the total volume contraction is $98 \times 10^{18}$ m$^3$.

Dual Electrode Design with a Central Electrode and a Ring Electrode

A single central drive electrode and a single ring-shaped drive electrode can be combined to create a dual electrode design. A unipolar (e.g., negative) voltage pulse at zero quiescent bias can be applied to the ring-shaped drive electrode and the central drive electrode consecutively, to first expand and then contract the pumping chamber. Unlike the single electrode design shown in FIGS. 2A-3C, the pumping voltage differential is effectively reduced in a dual electrode design because the total volume displacement required for a pumping cycle is divided between the expansion phase and the contraction phase. In addition, for a given drive voltage differential, the size of the pumping chamber under the dual-electrode can be significantly smaller than that in a single electrode design because of the larger membrane deflection created by the dual-electrode. Therefore, a higher density of pumping chambers and nozzles can be packed in a printhead module that utilizes the dual electrode design, creating higher printing resolution.

Figure 5A:
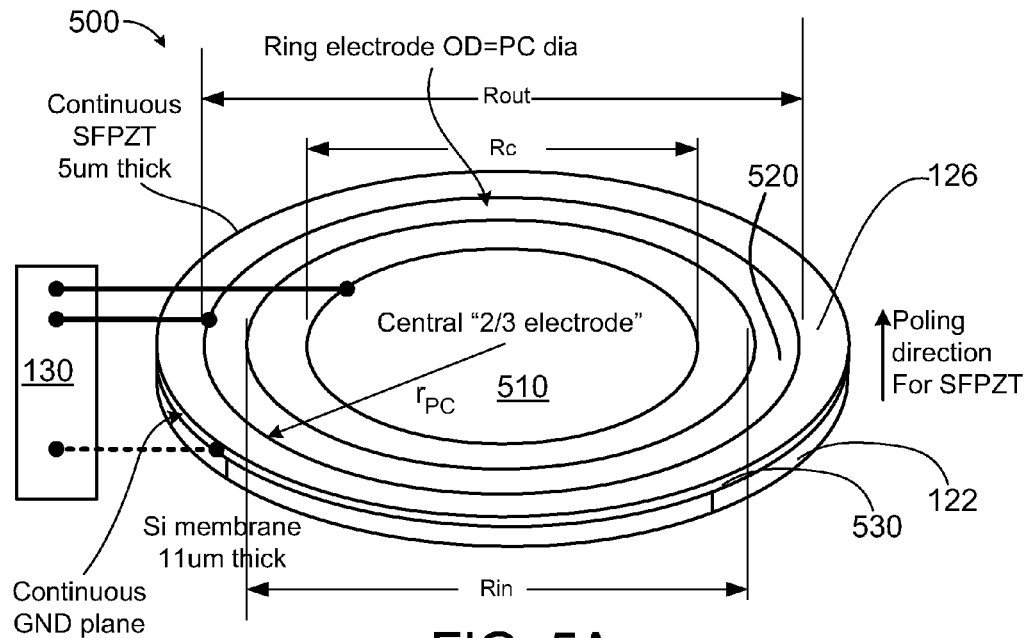
FIG. 5A is a schematic diagram of a dual electrode piezoelectric actuator including an inner drive electrode (e.g., a central electrode) and an outer drive electrode (e.g., a ring-shaped electrode) surrounding the inner drive electrode.

FIG. 5A is a schematic diagram of a dual-electrode piezoelectric actuator including an inner drive electrode (e.g., a central electrode), an outer drive electrode (e.g., a ring-shaped electrode) encircling the inner drive electrode, and an opposing reference electrode.

In FIG. 5A, the inner drive electrode 510 and the outer drive electrode 520 are insulated from each other by a gap between the electrodes. In this example, the inner drive electrode 510 is a circular conductive disc, and the outer drive electrode 520 is a conductive annular ring. The lateral dimension $R_c$ of the inner drive electrode is smaller than the inner lateral dimension of the outer drive electrode $R_{in}$. The outer dimension of the outer drive electrode $R_{out}$ is greater or equal to the lateral dimension of the membrane over the pumping chamber.

The inner and outer drive electrodes are positioned on the top surface of the piezoelectric layer 126. The inner drive electrode 510 is disposed over a central portion of the membrane over the pumping chamber. The outer drive electrode 520 is disposed over a peripheral portion of the membrane over the pumping chamber. The outer drive electrode covers the perimeter of the membrane. The inner and outer edges of the outer drive electrode 520 are aligned and spaced apart from the pumping chamber wall.

The bottom surface of the piezoelectric layer 126 is in contact with a reference electrode 530. The bottom surface of the reference electrode 530 is in contact with the actuator membrane 122. The reference electrode 530 can be continuous and spans both the inner and the outer drive electrodes. The reference electrode 530 can also span drive electrodes of multiple actuators. Alternatively, the reference electrode can also be segmented into inner and outer portions that correspond to the inner and outer drive electrodes, and the portions can be separately controllable. The inner portions of the reference electrodes of multiple actuators can be electrically connected to a first common reference voltage and commonly controlled, and the outer portions of the reference electrodes of multiple actuators can be electrically connected to a second common reference voltage and commonly controlled (but separately from the inner portions).

The inner drive electrode 510, the outer drive electrode 520, and the reference electrode 530 are coupled to a controller 130. The controller 130 can supply the appropriate drive voltages for actuating the piezoelectric membrane over the pumping chamber. In some implementations, the outer drive electrode 520 can have one or more small slits that cut across the width of the ring to allow access to the inner drive electrode 510. For example, a slit across the width of the outer drive electrode 520 can be used to accommodate a conductive path between the inner drive electrode 510 and the controller 130. The existence of a slit will not substantially affect the operation of the drive electrodes if the width of the slit is small compared to the size of the outer drive electrode, and the outer drive electrode can still substantially enclose the inner drive electrode 510. Alternatively, an insulated conductive path can be placed over or under the outer drive electrode 520 to connect to the inner electrode 510 to the controller 130.

In this particular example, the dual electrode piezoelectric actuator includes a piezoelectric layer made of a PZT film (e.g., a continuous PZT film that spans beyond the membrane). The PZT film is approximately 5 microns thick, and has a poling direction pointing from the bottom surface to the top surface, i.e., substantially perpendicular to the membrane. The thickness for the PZT film can range from about 0.5 micron to 10 microns. The membrane layer is a silicon membrane approximately 11 micron thick. The flexible portion of the membrane layer forms the membrane over the pumping chamber. The pumping chamber and the membrane each has a lateral dimension of 150 microns. The inner drive electrode has a radius of roughly two thirds (⅔) of the lateral dimension of the pumping chamber. The outer electrode has an outer dimension that is at least equal to or greater than the lateral dimension of the pumping chamber (or the lateral dimension of the membrane).

Figure 5B:
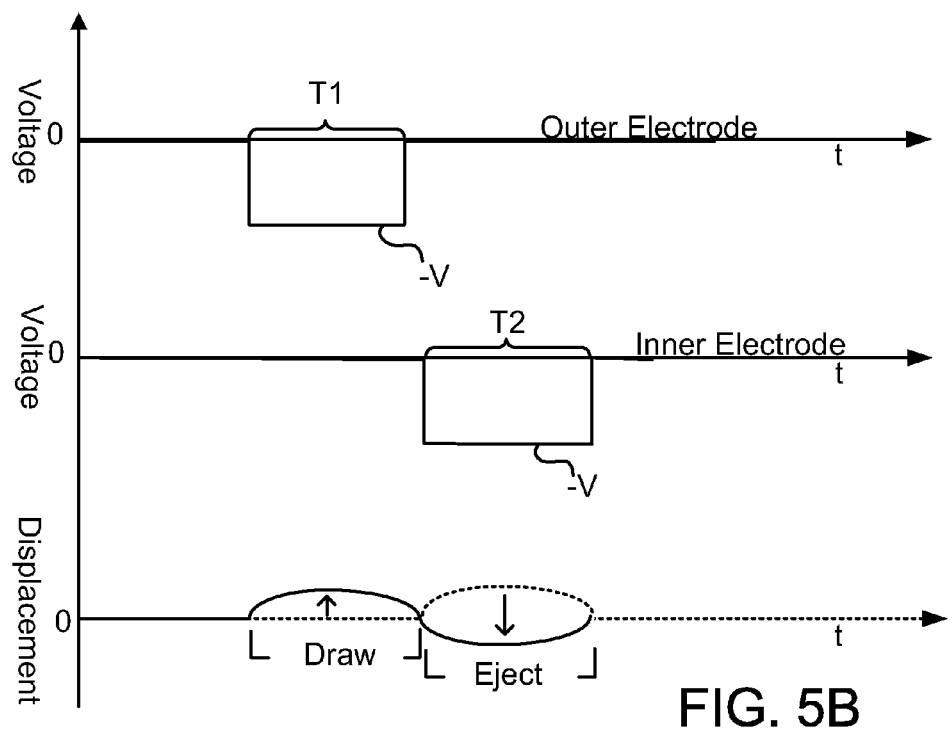
FIG. 5B illustrates exemplary drive voltage waveforms on the central electrode and the ring-shaped electrode for a droplet ejection cycle in a fluid ejection system utilizing the dual electrode piezoelectric actuator of FIG. 5A.

FIG. 5B illustrates exemplary drive voltage waveforms on the inner drive electrode and the outer drive electrode relative to the reference electrode (i.e., a continuous reference electrode that spans both the inner and the outer electrodes in this example) for a droplet ejection cycle in the fluid ejection system utilizing the dual electrode piezoelectric actuator shown in FIG. 5A.

In the dual electrode design, the drive electrodes are kept neutral during idle. No quiescent bias is applied to either drive electrode relative to the reference electrode. During a fluid ejection cycle, a first negative voltage pulse is applied to the outer drive electrode to expand the pumping chamber during a time period T1; then a second negative voltage pulse is applied to the inner drive electrode to contract the pumping chamber during a time period T2. FIG. 5B illustrates the correspondence between the drive voltages applied to the drive electrodes relative to the reference electrode and the shape of the membrane during the pumping cycle. For the same drive voltage magnitude V, the total volume displacement caused by the dual electrode actuator is the sum of the total volume displacements of the inner drive electrode and the outer drive electrode under the same drive voltages. In some implementations, the drive voltage applied on the inner drive electrode and the outer drive electrode can be of the same or different magnitudes depending on the particular design and/or operation requirements.

The drive voltage pulses can be supplied by a controller 130 electrically coupled to the inner and outer drive electrodes, and the reference electrode. The controller 130 is operable to generate or obtain a waveform for the negative voltage pulses. The controller can receive or generate control signals that control the timing, duration, magnitude, and time lag of the drive pulses on each electrode. The duration of the drive voltage pulse can be determined based on the time needed for the actuator membrane to reach maximum deflection. The time lag between the first drive voltage pulse and the second drive voltage pulse can be determined based on the time it takes the membrane to return to its relaxed state from the expanded state.

Optimization and Variations of the Piezoelectric Actuator

The relative size of the drive electrode and the pumping chamber affects the total volume displacement that can be achieved in both the single electrode designs (a central drive electrode or a ring-shaped drive electrode) and the dual electrode design (an inner drive electrode and an outer drive electrode surrounding the inner drive electrode). The maximum total volume displacement can be achieved for an electrode of a particular shape by adjusting the electrode size.

Figure 6:
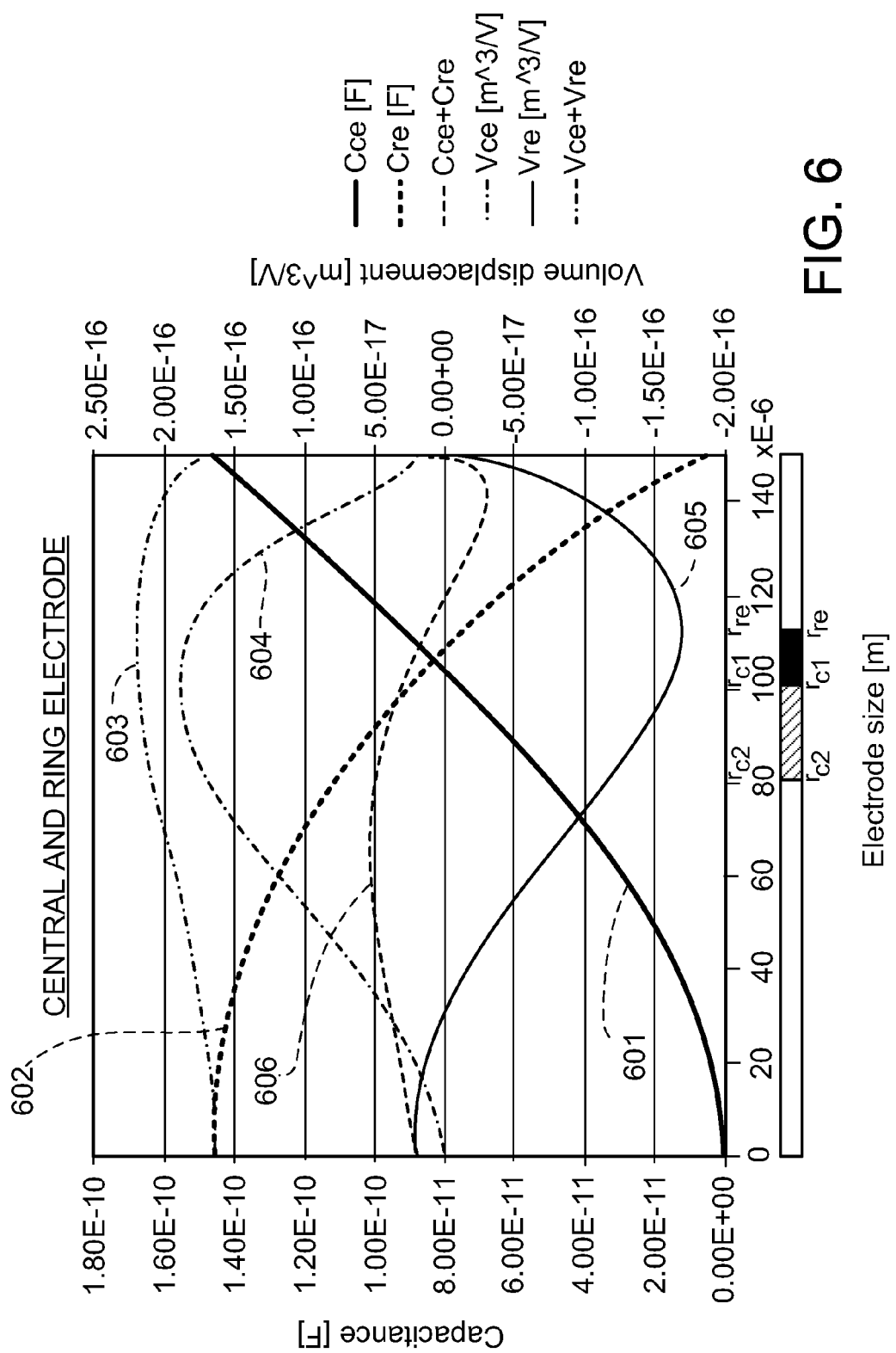
FIG. 6 is a plot illustrating the correlations between volume displacement per volt and the lateral dimensions of the central and the ring-shaped drive electrodes in relation to the lateral dimension of the pumping chamber.

FIG. 6 is a plot illustrating the correlations between volume displacement per volt and the lateral dimensions of the central and the ring-shaped drive electrodes in relation to the lateral dimension of the pumping chamber. In this plot, the dimension of the pumping chamber is identical to the dimension of the membrane over the pumping chamber (i.e., the walls of the pumping chamber are perpendicular to the membrane).

These plots are for electrodes of circular shapes (i.e., a circular disc or an annual ring) placed at the center of the actuator membrane over a pumping chamber. The pumping chamber has a radius of 150 microns. The actuator membrane is 11 microns thick. The piezoelectric layer is 5 microns thick. Although the exact values shown in the plot are specific to this particular configuration, the correlations between the volume displacement and electrode size are illustrative of electrodes and pumping chambers of other sizes and shapes.

The horizontal axis of the plot shows the distance from the center of the pumping chamber. The maximum distance shown is 150 microns, the radius of the pumping chamber. The vertical axis on the left is the capacitance (F) of the electrodes. The vertical axis on the right is the volume displacement per volt (m$^3$/volt). Curve 601 is the correlation between the capacitance of a circular central electrode and the radius of the circular central electrode. Curve 602 is the correlation between the capacitance of a circular ring-shaped electrode and the inner radius of the circular ring-shaped electrode. Curve 603 is the sum of the Curve 601 and the Curve 602. Curve 604 is the correlation between the volume displacement of a circular central electrode and the radius of the circular central electrode. Curve 605 is the correlation between the volume displacement of a circular ring-shaped central electrode and inner radius of the circular ring-shaped electrode. Curve 606 is the sum of the Curves 604 and 605.

Curve 604 shows that a positive drive voltage on a central electrode produces a positive volume displacement (i.e., chamber expands). The maximum expansion occurs as the radius of the circular electrode reaches about 100 microns, which is about two thirds (⅔) of the pumping chamber radius. Before the radius of the central electrode reaches two thirds (⅔) of the pumping chamber radius, the volume displacement increases with electrode radius; after the radius reaches ⅔ of the pumping chamber radius, the volume displacement starts to decrease with electrode radius. Although FIG. 6 only shows electrode radius up to the pumping chamber radius, it can be seen from the non-zero volume displacement at pumping chamber radius that electrode radius that goes slight beyond the pumping chamber radius can still produce volume displacement in the pumping chamber.

Curve 605 shows that a positive drive voltage on a ring-shaped drive electrode produces a negative volume displacement (i.e., the chamber contracts). The maximum contraction occurs as the inner radius of the ring-shaped electrode reaches about 112 microns. The out radius of the ring-shaped drive electrode is the same as the pumping chamber radius in this plot. However, the outer radius can be, and preferably is, slightly greater than the pumping chamber radius. For example, for a pumping chamber with a radius of 150 microns, the outer radius of the ring-shaped drive electrode can be 155-160 microns.

It can be seen that the ring-shaped electrode is slightly less efficient than the central electrode regarding maximum volume displacement. For example, the maximum volume displacement for the circular central electrode is roughly 1.9× $10^{-16}$ m$^3$/volt at radius, $r_{c1}$=100 microns. The maximum volume displacement for the circular ring-shaped electrode is roughly 1.7×$10^{-16}$ m$^3$/volt at inner radius, $r_{re}$=112 microns. In one dual electrode design, the radius of the central drive electrode and the inner radius of the ring-shaped drive electrode are both chosen to achieve the maximum volume displacement in the pumping chamber. In this particular example, such design requires approximately a 12-micron gap between the central and the ring-shaped drive electrodes.

In an alternative dual electrode design, the radius for the inner drive electrode (e.g., the central drive electrode) and the inner radius of the outer drive electrode (e.g., the ring-shaped drive electrode) are such that the volume displacement is equal for the two drive electrodes. If the inner radius of the ring-shaped drive electrode is $r_{re}$, the radius of the central drive electrode is $r_{c2}$=80 microns. The volume displacement per volt would be the same in magnitude for the ring-shaped drive electrode and the central drive electrode at 1.7×$10^{-16}$ m$^3$/volt. In this design, there is approximately a 32 micron gap between the electrodes.

Figure 7:
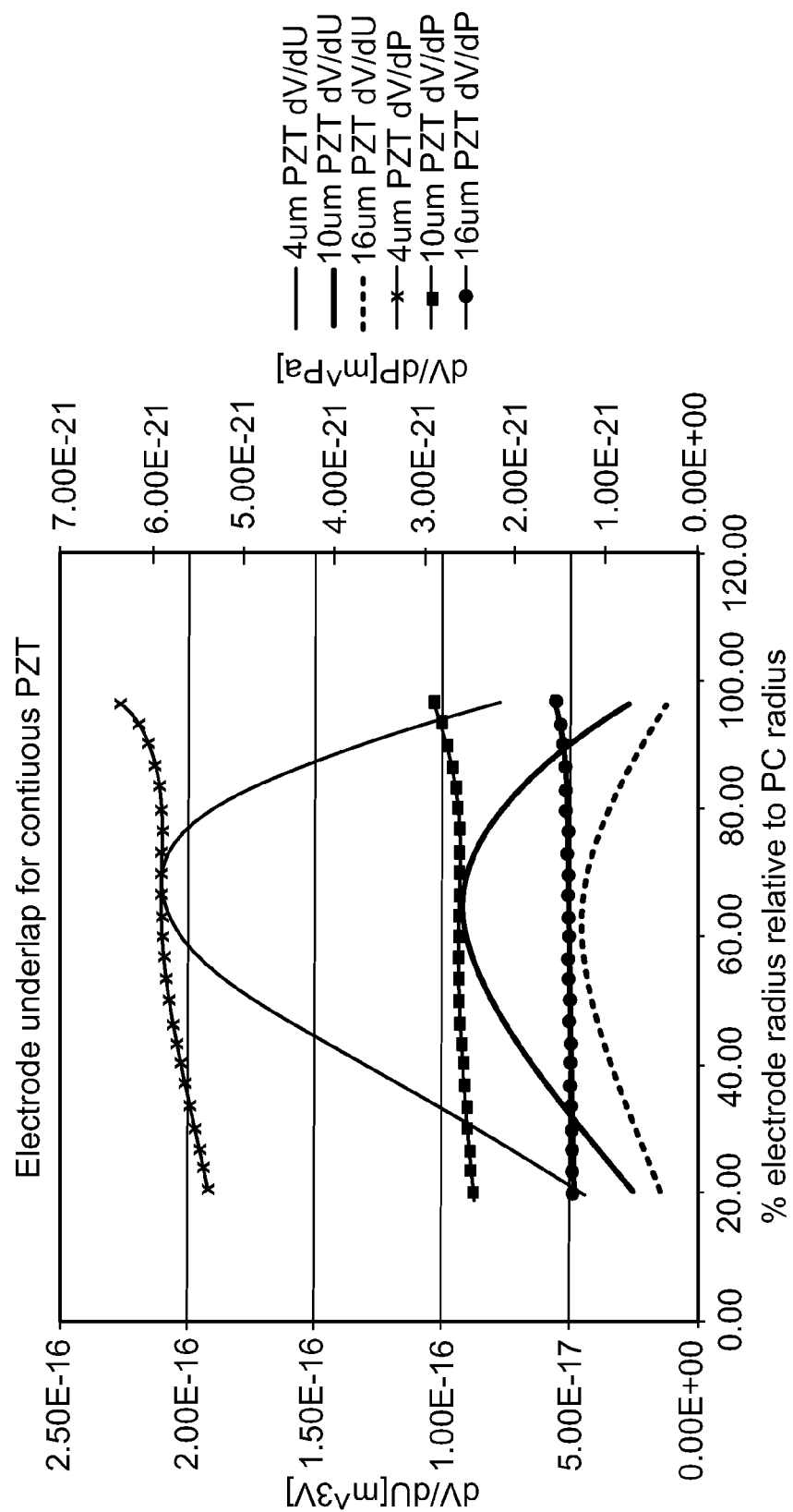
FIG. 7 is a plot illustrating the correlation between volume displacement per volt (dV/dU) in the pumping chamber and percentage of drive electrode radius relative to pumping chamber radius (%).

In addition to the relative sizes of the pumping chamber and the drive electrodes, the maximum volume displacement is also affected slightly by the thickness of the piezoelectric layer. FIG. 7 is a plot illustrating the correlation between volume displacement per volt (dV/dU) in the pumping chamber and percentage of a central drive electrode radius relative to pumping chamber radius (%). In general, the volume displacement per volt peaks when the radius of the central drive electrode reaches about ⅔ of the pumping chamber radius. However, depending on the thickness of the PZT film, the peak shifts slightly. For example, with a thicker PZT film, the peak shifts to a slightly smaller electrode radius, and for a thinner PZT film, the peak shifts to a slightly larger electrode radius. In general, the volume displacement per volt reduces as the PZT film thickness increases. A possible design regime for the central drive electrode is about 60% to 80% of the pumping chamber radius. The thickness of the PZT film can range from 0.5 micron to 10 microns to maintain both sufficient flexibility for volume displacement and sufficient strength to pressurize the fluid in the pumping chamber.

Although the plots in FIGS. 6 and 7 are for a circular inner electrode and/or an annular ring-shaped outer electrode, similar dimensional correlations can be found for electrodes of other shapes. For example, the ring shape for the outer electrode is not limited to circular but rather can include other shapes (e.g., oval, polygonal, square, rectangular, triangular, and so on) with an open center. In addition, in some implementations, a ring shape can include a gap cut across the width of the ring (e.g., to accommodate a path connecting the inner electrode to the controller). In some implementations, a ring-shaped drive electrode can have more than one slit cut across the width of the ring such that it is no longer a single conductive piece. In such implementations, the several segments of the ring-shaped electrode can be tied to a common control signal or controlled synchronously to act as a single ring-shaped drive electrode. In such implementations, such slits do not substantially alter the effectiveness of the ring-shaped drive electrode if the width and/or number of the slits are small relative to the size of the ring, such that the segments of the ring-shaped electrode still substantially enclose the central region surrounded by the segments of the ring-shaped drive electrode.

Similarly, the inner drive electrode is not limited to a circular disc, and can have any shape (e.g., oval, polygonal, square, rectangular, or triangular, and so on). In some implementations, the inner drive electrode can include one or more cuts so long as the cuts are small compared to the area of the inner drive electrode and all segments of the inner electrode are tied to a common control signal or controlled synchronously to act as a single central drive electrode. In some implementations, the inner drive electrode can include one or more openings in it (e.g., a ring, an open ring, or a disc with holes in it). The presence of the one or more openings do not substantially interfere with the operation of the inner drive electrode if the openings are small in number and size relative to the size of the inner drive electrode.

Positions of the drive electrodes can also affect the performance of the piezoelectric actuator. The central and/or inner drive electrode can be disposed generally over the central portion of the membrane over the pumping chamber. In the designs shown in FIGS. 2-5, the circular central or inner drive electrodes are disposed at the center of the membrane over pumping chamber. The location of the central or inner drive electrode can be varied slightly in some implementations (e.g., to accommodate shape of the pumping chamber or positions of other components of the fluid ejector unit). Typically, by placing the inner drive electrode over the central portion of the membrane, greater deflection of the membrane can be achieved. However, some off-set from the central portion may be desirable depending on the particular design of the drive electrode and the shape of the pumping chamber.

Similarly, the ring-shaped and/or the outer drive electrode can be disposed over the peripheral portion of the membrane with its opening generally over the central portion of the membrane. In the designs shown in FIGS. 3-5, the ring-shaped and/or outer drive electrode have inner and outer edges substantially aligned with the perimeter of the pumping chamber wall and covers the entire (or substantially the entire) periphery of the pumping chamber. Such aligned positioning of the ring-shaped and/or outer drive electrode can allow greater membrane deflection than the unaligned positioning.

The inner and outer perimeters of the ring-shaped electrode do not have to be geometrically similar or concentric. However, in some implementations, the width of the ring is roughly uniform around the entirety of the ring or most of the ring. Similarly, the outer perimeter of the inner electrode and the inner perimeter of the ring-shaped electrode do not have to be geometrically similar or concentric. However, in some implementations, the gap between the inner electrode and the outer electrode can be roughly uniform around the entirety of the inner electrode.

The reference electrode can be segmented between the portions each opposing a respective inner or the outer drive electrode of an actuator. The reference electrode can also be continuous and span both the inner and the outer drive electrodes of an actuator. In some designs, a continuous reference electrode can span electrodes of multiple actuators. In some designs, reference electrodes of multiple actuators or segmented portions of a reference electrode for a single actuator can be tied to a common control signal or controlled synchronously.

The piezoelectric material can be continuous and span over the entire area over the pumping chamber and beyond. In some implementations, the continuous piezoelectric material can span several actuators. Alternatively, the piezoelectric material can include cuts in regions that do not overlie the pumping chambers, in order to segment the piezoelectric material of the different actuators from each other and reduce cross-talk.

Figure 8A:
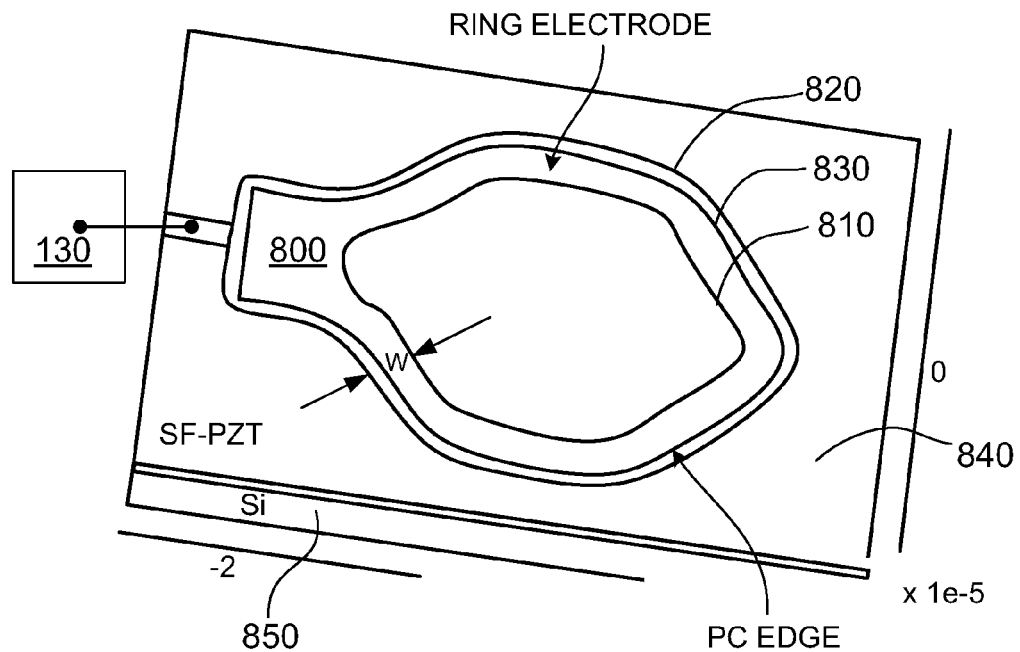
FIG. 8A is a piezoelectric actuator with an exemplary ring-shaped electrode over a continuous PZT layer.
Figure 8B:
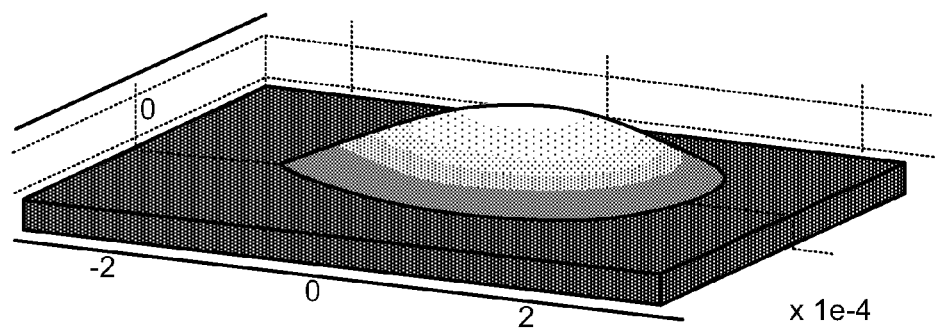
FIG. 8B illustrates the deflection of the PZT layer in FIG. 8A under an applied voltage between the ring-shaped electrode and a reference electrode.

FIG. 8A shows a piezoelectric actuator with another exemplary ring-shaped electrode 800 over a continuous PZT layer. FIG. 8B illustrates the deflection of the PZT layer under the exemplary ring-shaped electrode 800 in FIG. 8A.

In this design, the shape of the ring is defined by an inner shape formed by the inner edge 810 of the ring, and an outer shape formed by the outer edge 820 of the ring. The inner shape of the ring is roughly a hexagon, except one apex of the hexagon that is connected to the external voltage source or controller 130 is slightly elongated and rounded. The outer shape of the ring is similar to that of the inner shape, and the inner shape and the outer shape are roughly concentric such that the width (W) of the ring is roughly the same around the ring, except for the side that connects to the voltage source or controller 130.

The ring-shaped electrode 800 in FIG. 8A is placed on the top surface of a continuous piezoelectric film 840 and over a pumping chamber. The pumping chamber edge 830 is entirely underneath the ring-shaped electrode 800. The shape of the ring also tracks the shape of the pumping chamber closely. Therefore, the ring is substantially aligned with the perimeter of the membrane over the pumping chamber. A continuous reference electrode is disposed between the piezoelectric film 840 and the silicon substrate 850.

FIG. 8B shows a simulation result for the deflection of the piezoelectric (e.g., PZT) film when a negative voltage is applied to the ring-shaped drive electrode 800 relative to the reference electrode. The membrane bow outwardly (away from the pumping chamber), and the pumping chamber is expanded.

The design of the inner and outer drive electrodes in a dual electrode design and the design for the ring-shaped electrode in a single electrode design can also take into consideration that the static and dynamic deflection for the piezoelectric membrane at 0 Hz and at the pumping chamber mechanical resonance frequency should be roughly the same.

Although the drive voltages discussed above are simple rectangular voltage pulses, much more complex voltages can be applied, e.g., in order to control the size, velocity or number of fluid drops ejected.

Although the piezoelectric material discussed with respect to the above examples has a poling direction pointing away from the pumping chamber. In some implementations, a prefixed piezoelectric layer (e.g., bulk piezoelectric material that is fired before being bonded to a module substrate) having a poling direction pointing toward the pumping chamber can be attached to the membrane. In such implementations, the voltage pulses could be similarly reversed to achieve the same pumping actions.

Although the discussions above refer to a configuration where the drive electrode layer is placed over the exposed side of the piezoelectric layer and the reference electrode layer is disposed between the piezoelectric layer and the membrane layer, the positions of the drive electrode and the reference electrode layers can be reversed as well. For a given a poling direction of the piezoelectric material relative to the pumping chamber (i.e., either pointing away or toward the pumping chamber), the voltage pulses applied to the drive electrodes relative to the reference electrode could be similarly reversed to achieve the same pumping actions.

The selection of appropriate pumping voltage pulses on each drive electrode in each configuration can be based on the following basic behaviors of the outer (e.g., ring-shaped) drive electrode and the inner (e.g., central) drive electrode.

The basic behaviors of a ring-shaped drive electrode are as follows: when a voltage differential applied between the ring-shaped drive electrode and the reference electrode creates an electric field that points in the same direction as the poling direction of the piezoelectric material between the ring-shaped drive electrode and the reference electrode, the pumping chamber expands; when a voltage differential applied between the ring-shaped drive electrode and the reference electrode creates an electric field that points in a direction opposite to the poling direction of the piezoelectric material between the ring-shaped drive electrode and the reference electrode, the pumping chamber contracts.

The basic behaviors of a central drive electrode are as follows: when a voltage differential applied between the central drive electrode and the reference electrode creates an electric field that points in the same direction as the poling direction of the piezoelectric material between the central drive electrode and the reference electrode, the pumping chamber contracts; when a voltage differential applied between the central drive electrode and the reference electrode creates an electric field that points in a direction opposite to the poling direction of the piezoelectric material between the central drive electrode and the reference electrode, the pumping chamber expands.

There are four situations where the voltage differential between a drive electrode and a reference electrode can create an electric field that points in the same direction as the poling direction of the piezoelectric material.

First, when the poling direction of the piezoelectric material points away from the pumping chamber, if the electrodes are positioned such that the poling direction also points from the reference electrode layer to the drive electrode layer, then a negative voltage differential between the drive electrode and the reference electrode creates an electric field that points in the same direction as the poling direction of the piezoelectric material.

Second, when the poling direction of the piezoelectric material points away from the pumping chamber, if the electrodes are positioned such that the poling direction points from the drive electrode layer to the reference electrode layer, then a positive voltage differential is needed between the drive electrode and the reference electrode to create an electric field that points in the same direction as the poling direction of the piezoelectric field.

Third, when the poling direction of the piezoelectric material points toward the pumping chamber, if the electrodes are positioned such that the poling direction also points from the reference electrode layer to the drive electrode layer, then a negative voltage differential between the drive electrode and the reference electrode creates an electric field that points in the same direction as the poling direction of the piezoelectric material.

Fourth, when the poling direction of the piezoelectric material points toward the pumping chamber, if the electrodes are positioned such that the poling direction points from the drive electrode layer to the reference electrode layer, then a positive voltage differential is needed between the drive electrode layer and the reference electrode layer to create an electric field that points in the same direction as the poling direction of the piezoelectric field.

There are similarly four situations where the voltage differential between a drive electrode and a reference electrode can create an electric field that points in a direction opposite to the poling direction of the piezoelectric material.

During a pumping cycle, it is sometimes preferred to have electric fields that point in the same direction as the poling direction of the piezoelectric material during both the expansion and the contraction phase (such as in the dual electrode design example). In some implementations, it is possible to have an electric field pointing in the same direction as the poling direction only during the expansion phase of the pumping cycle, and the contraction is carried out by the natural relaxation of the membrane in the absence of an applied electric field. Application of an electric field that points in the same direction as the poling direction helps reduce depolarization and fatigue of the piezoelectric material, however, in practice, this preference may be forgone to achieve other goals.

During a pumping cycle, it is preferable to first expand and then contract the pumping chamber. When using a single ring-shaped drive electrode, an electric field pointing in the same direction as the poling direction can be generated first for a time period T to expand the pumping chamber, and then eliminated to restore the pumping chamber to its relaxed state. For further contraction, after the expansion period, an electric field pointing in a direction opposite to the poling direction can be applied for a time period T', although this will tend to deteriorate the piezoelectric material.

When using a dual electrode design with an inner drive electrode and an outer drive electrode, in order to expand the pumping chamber, a first voltage differential is applied between the outer drive electrode and the reference electrode to create an electric field pointing in the same direction as the poling direction of the piezoelectric material for a first time period T1; then, to contract the pumping chamber, a second voltage differential is applied between the inner drive electrode and the reference electrode to create an electric field that also points in the same direction as the poling direction of the piezoelectric material for a second time period T2. This sequence of operation reduces depolarization of the piezoelectric material since the electric field created in the piezoelectric material points in the same direction as the poling direction during the entire pumping cycle (e.g., expansion and contraction periods). In some implementations, it is possible to reverse the voltage application, for example, by applying a first voltage differential on the inner electrode to generate an electric field that points in a direction opposite to the poling direction to expand the chamber first, and then applying a second voltage differential on the outer drive electrode to generate another electric field that points in a direction opposite to the poling direction to contract the chamber. However, this sequence of operation would increase depolarization of the piezoelectric material, and reduce the life span and effectiveness of the piezoelectric actuator.

The use of terminology such as "front" and "back," "top" and "bottom," or "horizontal" and "vertical" throughout the specification and claims is to distinguish the relative positions or orientations of various components of the printhead module and other elements described therein, and does not imply a particular orientation of the printhead module with respect to gravity.

While this specification contains many specific implementation details, unless explicitly stated in the claims, these should not be construed as limitations on the scope of any invention or of what may be claimed, but rather as descriptions of features that may be specific to particular embodiments of particular inventions.

What is claimed:

1. A method for actuating a pumping chamber, comprising:
    generating a voltage differential for a time period between a drive electrode and a reference electrode of a piezoelectric actuator to expand the pumping chamber, wherein:
        the pumping chamber is a cavity formed in a substrate, the cavity being covered by a membrane that is operable to expand or contract the pumping chamber by flexing;

the piezoelectric actuator is supported on the membrane and comprises a piezoelectric layer disposed between a drive electrode layer and a reference electrode layer;

the piezoelectric layer comprises a continuous planar piezoelectric material spanning the chamber and having a uniform poling direction that is substantially perpendicular to the continuous planar piezoelectric material;

the drive electrode layer comprises the drive electrode in contact with the continuous planar piezoelectric material, the drive electrode being in the shape of a ring, disposed over a peripheral portion of the membrane, and being the sole drive electrode over the membrane in the drive electrode layer;

the reference electrode layer comprises the reference electrode spanning at least an area covered by the drive electrode; and the creation of the voltage differential between the drive electrode and the reference electrode generates an electric field in the continuous planar piezoelectric material, the electric field resulting in actuation of the continuous planar piezoelectric material to flex the membrane.

2. The method of claim 1, further comprising:
removing the voltage differential after the time period to contract the chamber.

3. The method of claim 2, wherein:
the uniform poling direction of the continuous planar piezoelectric material points from the reference electrode layer to the drive electrode layer, and the voltage differential is a negative voltage differential.

4. The method of claim 3, wherein:
the uniform poling direction of the continuous planar piezoelectric material points away from the chamber.

5. The method of claim 1, wherein the membrane has a lateral dimension of D, the drive electrode has an inner lateral dimension and an outer lateral dimension, and the outer lateral dimension of the drive electrode is greater than the lateral dimension of the membrane.

6. The method of claim 5, wherein the inner lateral dimension of the drive electrode is such that a maximum volume displacement is achieved between expansion and contraction of the chamber.

7. The method of claim 6, wherein the continuous planar piezoelectric material is a lead zirconate titanate (PZT) film.

* * * * *